United States Patent
Mulder et al.

(10) Patent No.: US 6,628,224 B1
(45) Date of Patent: Sep. 30, 2003

(54) DISTRIBUTED AVERAGING ANALOG TO DIGITAL CONVERTER TOPOLOGY

(75) Inventors: Jan Mulder, Houten (NL); Christopher Michael Ward, Utrecht (NL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/153,709

(22) Filed: May 24, 2002

(51) Int. Cl.[7] ............................ H03M 1/12; H03M 1/36
(52) U.S. Cl. ........................................ 341/156; 341/159
(58) Field of Search ................................ 341/120, 156, 341/159, 157, 133; 375/285; 708/313; 330/88, 150; 327/108

(56) References Cited

U.S. PATENT DOCUMENTS

| | | |
|---|---|---|
| 3,697,978 A | 10/1972 | Prill |
| 3,846,712 A | 11/1974 | Kiko |
| 4,959,563 A | 9/1990 | Schenck |
| 5,006,727 A | 4/1991 | Ragosch et al. |
| 5,118,971 A | 6/1992 | Schenck |
| 5,157,397 A * | 10/1992 | Vernon ..................... 341/157 |
| 5,191,336 A | 3/1993 | Stephenson |
| 5,302,869 A | 4/1994 | Hosotani et al. |
| 5,471,210 A * | 11/1995 | Wingender et al. ......... 341/156 |
| 5,554,943 A | 9/1996 | Moreland |
| 5,867,116 A * | 2/1999 | Nakamura et al. .......... 341/159 |
| 5,973,632 A | 10/1999 | Tai |
| 6,169,502 B1 | 1/2001 | Johnson et al. |
| 6,259,745 B1 | 7/2001 | Chan ........................ 375/285 |
| 6,489,913 B1 | 12/2002 | Hansen et al. |
| 6,583,747 * | 6/2003 | van der Goes et al. ..... 341/156 |

OTHER PUBLICATIONS

Abo, A.M. and Gray, P.R., "A 1.5–V, 10–bit, 14.3–MS/s CMOS Pipeline Analog–to–Digital Converter," *IEEE Journal of Solid–State Circuits*, IEEE , vol. 34, No. 5, May 1999, pp. 599–606.

Brandt, B.P. and Lutsky, J., "A 7–mW, 10–b, 20–MSPS CMOS Subranging ADC with 9.5 Effective Bits at Nyquist," *IEEE Journal of Solid–State Circuits*, IEEE, vol. 34, No. 12, Dec. 1999, pp. 1788–1795.

Bult, Klaas and Buchwald, Aaron, "An Embedded 240–mW 10–b 50–MS/s CMOS ADC in 1–mm$^2$," *IEEE Journal of Solid–State Circuits*, IEEE, vol. 32, No. 12, Dec. 1997, pp. 1887–1895.

Cho, T.B. and Gray, P.R., "A 10 b, 20 Msample/s, 35mW Piepline A/D Converter," *IEEE Journal of Solid–State Circuits*, IEEE, vol. 30, No. 3 , Mar. 1995, pp. 166–172.

Choe, M–J. et al., "A 13–b 40–Msamples/s CMOS Pipelined Folding ADC with Background Offset Trimming," *IEEE Journal of Solid–State Circuits*, IEEE, vol. 35, No. 12, Dec. 2000, pp. 1781–1790.

(List continued on next page.)

*Primary Examiner*—Patrick Wamsley
(74) *Attorney, Agent, or Firm*—Sterne, Kessler, Goldstein & Fox

(57) ABSTRACT

An analog to digital converter includes a first amplifier array connected to taps from a reference ladder, a second amplifier array, wherein each amplifier in the first amplifier array is connected to only two amplifiers of the second amplifier array, a third amplifier array, wherein each amplifier in the second amplifier array is connected to only two amplifiers of the third amplifier array, and an encoder connected to outputs of the third amplifier array that converts the outputs to an N-bit digital signal.

33 Claims, 13 Drawing Sheets

OTHER PUBLICATIONS

Choi, M. and Abidi, A., "A 6–b 1.3–Gsample/s A/D Converter in 0.35– µm CMOS," *IEEE Journal of Solid–State Circuits*, IEEE, vol. 36, No. 12, Dec. 2001, pp. 1847–1858.

Flynn, M. and Sheahan, B., "A 400–Msample/s, 6–b CMOS Folding and Interpolating ADC," *IEEE Journal of Solid–State Circuits*, IEEE, vol. 33, No. 12, Dec. 1998, pp. 1932–1938.

Geelen, G., "A 6b 1.1GSample/s CMOS A/D Converter," IEEE International Solid–State Circuits Conference, IEEE, 2001, pp. 128–129 and 438.

Hoogzaad, G. and Roovers, R., "A 65–mW, 10–bit, 40–Msample/s BiCMOS Nyquist ADC in 0.8 mm$^2$," *IEEE Journal of Solid–State Circuits*, IEEE, vol. 34, No. 12, Dec. 1999, pp. 1796–1802.

Hosotani, S. et al., "An 8–bit 20–MS/s CMOS A/D Converter with 50–mW Power Consumption," *IEEE Journal of Solid–State Circuits*, IEEE, vol. 25, No. 1, Feb. 1990, pp. 167–172.

Ingino, J.M. and Wooley, B.A., "A Continuously Calibrated 12–b, 10–MS/s, 3.3–V A/D Converter," *IEEE Journal of Solid–State Circuits*, IEEE, vol. 33, No. 12, Dec. 1998, pp. 1920–1931.

Ito, M. et al., "A 10 bit 20 MS/s 3 V Supply CMOS A/D Converter," *IEEE Journal of Solid–State Circuits*, IEEE, vol. 29, No. 12, Dec. 994, pp. 1531–1536.

Kattman, K. and Barrow, J., "A Technique for Reducing Differential Non–Linearity Errors in Flash A/D Converters," *IEEE International Solid–State Conference*, IEEE, 1991, pp. 170–171.

Kusumoto, K. et al., "A 10–b 20–MHz 30–mW Pieplined Interpolating CMOS ADC," *IEEE Journal of Solid–State Circuits*, IEEE, vol. 28, No. 12, Dec. 1993, pp. 1200–1206.

Lewis, S. et al., "A 10–b 20–Msample/s Analog–to–Digital Converter," *IEEE Journal of Solid–State Circuits*, IEEE, vol. 27, No. 3, Mar. 1992, pp. 351–358.

Mehr, I. and Singer, L., "A 55–mW, 10–bit, 40–Msample/s Nyquist–Rate CMOS ADC," *IEEE Journal of Solid–State Circuits*, IEEE, vol. 35, No. 3, Mar. 2000, pp. 318–325.

Nagaraj, K. et al., "Efficient 6–Bit A/D Converter Using a 1–Bit Folding Front End," *IEEE Journal of Solid–State Circuits*, IEEE, vol. 34, No. 8, Aug. 1999, pp. 1056–1062.

Nagaraj, K. et al., "A Dual–Mode 700–Msamples/s 6–bit 200–Msamples/s 7–bit A/D Converter in a 0.25–µm Digital CMOS," *IEEE Journal of Solid–State Circuits*, IEEE, vol. 35, No. 12, Dec. 2000, pp. 1760–1768.

Nauta, B. and Venes, A., "A 70–MS/s 110–mW 8–b CMOS Folding and Interpolating A/D Converter," *IEEE Journal of Solid–State Circuits*, IEEE, vol. 30, No. 12, Dec. 1995, pp. 1302–1308.

Pan, H. et al., "A 3.3–V 12–b 50–MS/s A/D Converter in 0.6– µm CMOS with over 80–dB SFDR," *IEEE Journal of Solid–State Circuits*, IEEE, vol. 35, No. 12, Dec. 2000, pp. 1769–1780.

Song, W–C. et al., "A 10–b 20–Msample/s Low–Power Cmos ADC," *IEEE Journal of Solid–State Circuits*, IEEE, vol. 30, No. 5, May 1995, pp. 514–521.

Sumanen, L. et al., "A 10–bit 200–MS/s CMOS Parallel Piepline A/D Converter," *IEEE Journal of Solid–State Circuits*, IEEE, vol. 36, No. 7, Jul. 2001, pp. 1048–1055.

Taft, R.C. and Tursi, M.R., "A 100–MS/s 8–b CMOS Subranging ADC with Sustained Parametric Performance from 3.8 V Down to 2.2 V," *IEEE Journal of Solid–State Circuits*, IEEE, vol. 36, No. 3, Mar. 2001, pp. 331–338.

van der Ploeg, H. and Remmers, R., "A 3.3–V, 10–b 25–Msample/s Two–Step ADC in 0.35–µm CMOS," *IEEE Journal of Solid–State Circuits*, IEEE, vol. 34, No. 12, Dec. 1999, pp. 1803–1811.

van der Ploeg, H. et al., "A 2.5–V 12–b 54–Msample/s 0.25– µm CMOS ADC in 1–mm$^2$ With Mixed–Signal Chopping and Calibration," *IEEE Journal of Solid–State Circuits*, IEEE, vol. 36, No. 12, Dec. 2001, pp. 1859–1867.

Vorenkamp, P. and Roovers, R., "A 12–b, 60–Msample/s Cascaded Folding and Interpolating ADC," *IEEE Journal of Solid–State Circuits*, IEEE, vol. 32, No. 12, Dec. 1997, pp. 1876–1886.

Wang, Y–T. and Razavi, B., "An 8–bit 150–MHz CMOS A/D Converter," *IEEE Journal of Solid–State Circuits*, IEEE, vol. 35, No. 3, Mar. 2000, pp. 308–317.

Yotsuyanagi, M. et al., "A 2 V, 10 b, 20 Msample/s, Mixed–Mode Subranging CMOS A/D Converter," *IEEE Journal of Solid–State Circuits*, IEEE, vol. 30, No. 12, Dec. 1995, pp. 1533–1537.

Yu, P.C. and Lee, H–S., "A 2.5–V, 12–b, 5–Msample/s Pipelined CMOS ADC," *IEEE Journal of Solid–State Circuits*, IEEE, vol. 31, No. 12, Dec. 1996, pp. 1854–1861.

Miyazaki et al.,"A 16mW 30MSample/s 10b Pipelined A/D Converter using a Pseudo–Differential Architecture", *ISSCC 2002/Session 10/High–Speed ADCs/10.5*, Feb. 5, 2002, 3 pgs.

Sushihara et al., "A 7b 450MSample/s 50mW CMOS ADC in 0.3 mm$^2$", *ISSCC 2002/Session 10/High–Speed ADCs/ 10.3*, Feb. 5, 2002, 3 pgs.

Dingwall et al.,"An 8–MHz CMOS Subranging 8–Bit A/D Converter", *IEEE Journal of Solid–State Circuits*, vol. SC–20, No. 6, Dec. 1985, pp. 1138–1143.

Miyazaki et al., ISSCC 2002/Session 10/High–Speed ADCs/ 10.5, "A 16mW 30MSample/s 10b Pipelined A/D Converter using a Pseudo–Differential Architecture", Feb. 5, 2002, 3 pgs.

Sushihara et al., ISSCC 2002/Session 10/High–Speed ADCs/10.3, "A 7b 450MSample/s 50mW CMOS ADC in 0.3 mm$^2$", Feb. 5, 2002, 3 pgs.

Dingwall et al., IEEE Journal of Solid–State Circuits, vol. SC–20, No. 6, "An 8–MHz CMOS Subranging 8–Bit A/D Converter", Dec. 1985, pp. 1138–1143.

* cited by examiner

| "a" array - "b" array avging | "b" array - "c" array avging | "c" array - "d" array avging | prior art eff avg | proposed eff avg | improvement factor |
|---|---|---|---|---|---|
| 2 | 2 | | 2.666667 | 4 | 1.5 |
| 2 | 3 | | 3.6 | 6 | 1.66666667 |
| 3 | 2 | | 3.6 | 6 | 1.66666667 |
| 3 | 3 | | 4.263158 | 9 | 2.11111111 |
| 2 | 4 | | 4.571429 | 8 | 1.75 |
| 4 | 2 | | 4.571429 | 8 | 1.75 |
| 3 | 4 | | 5.142857 | 12 | 2.3333333 |
| 4 | 3 | | 5.142857 | 12 | 2.3333333 |
| 4 | 4 | | 5.818182 | 16 | 2.75 |
| 2 | 2 | 2 | 3.2 | 8 | 2.5 |

FIG. 10

DISTRIBUTED AVERAGING ANALOG TO DIGITAL CONVERTER TOPOLOGY

BACKGROUND OF THE INVENTION

1. Field of the Invention

The present invention relates to analog to digital converters (ADC's), and more particularly, to various topologies for high speed analog to digital converters that use interleaving of amplifier connections to reduce parasitic capacitance.

2. Related Art

A subranging analog to digital converter (ADC) architecture is suitable for implementing high-performance ADC's (i.e. high speed, low power, low area, high resolution). FIG. 1 shows the generic two-step subranging architecture, comprising a reference ladder 104, a coarse ADC 102, a switching matrix 103, a fine ADC 105, coarse comparators 107, fine comparators 108 and an encoder 106. In most cases, a track-and-hold 101 is used in front of the ADC. In this architecture, an input voltage is first quantized by the coarse ADC 102. The coarse ADC 102 compares the input voltage against all the reference voltages, or against a subset of the reference voltages that is uniformly distributed across the whole range of reference voltages. Based on a coarse quantization, the switching matrix 103 connects the fine ADC 105 to a subset of the reference voltages (called a 'subrange') that is centered around the input signal voltage.

Modern flash, folding and subranging analog to digital converters (ADC's) often use averaging techniques for reducing offset and noise of amplifiers used in the ADC. One aspect of averaging is the topology that is used to accomplish averaging, i.e., which amplifier outputs in which arrays of amplifiers are averaged together.

In general, flash, folding and subranging ADC's use cascades of distributed amplifiers to amplify the residue signals before they are applied to the comparators 107, 108. These residue signals are obtained by subtracting different DC reference voltages from an input signal $V_{in}$. The DC reference voltages are generated by the resistive ladder (reference ladder) 104 biased at a certain DC current. Two implementation aspects of averaging that should be distinguished are circuit implementation and topology.

With respect to circuit implementation, various ideas have been published in the literature, e.g., connecting resistors between amplifier outputs, and connecting capacitors between amplifier inputs. Interpolation is a type of averaging, and additional published techniques include capacitive interpolation, active interpolation using differential pairs, active interpolation using current mirrors, and active interpolation using current splitting.

In general, little attention has been paid to the second aspect: the averaging topology. FIG. 2 shows an example of a conventional averaging topology. As may be seen from FIG. 2, three arrays of amplifiers are used to effect an averaging topology: an "a" amplifier array, comprising amplifiers a1, a2, a3 . . . , a "b" amplifier array, comprising amplifiers b1, b2, b3 . . . , and a "c" amplifier array, comprising amplifiers c1, c2, c3. . . . The inputs of the "b" amplifiers combine several outputs of the "a" amplifiers, and the inputs of the "c" amplifiers combine several outputs of the "b" amplifiers. Taking the b2 amplifier as an example, the b2 amplifier is connected to amplifiers a1, a2, a3, a4 through a summer SB2. Similarly, the amplifier c2 is connected to the amplifiers b2 and b3 through a summer SC2. The amplifier c2 therefore ultimately combines the outputs of the amplifiers a1, a2, a3, a4 and a5 through the amplifiers b2 and b3 and the summers SB2 and SB3. Because of this, the weights on the inputs (i.e., the weights on the outputs of the amplifiers a1 . . . a5) are not equal.

Averaging is needed to improve noise and offset performance of the amplifiers. Since the signals are correlated (i.e., add linearly) and the noise is uncorrelated (root mean square addition) the signal to noise ratio (SNR) at the "b" array of amplifiers is nominally unity for each "a" amplifier, and $\sqrt{4}=2$ for 4 amplifiers. The downside of this arrangement is that many connections are needed between the "a" array and the "b" array. Another downside of this arrangement is the resulting different weighting coefficients, as discussed above, which detract from the root mean square additive property of noise.

The characteristic aspect of the topology of FIG. 2 is that averaging is ways performed on a set of neighboring amplifiers. For example, the amplifier b2 combines the outputs of the amplifiers a1, a2, a3 and a4, implementing 4× averaging. The amplifier c2 combines the outputs of amplifiers b2 and b3, implementing 2× averaging. Furthermore, the 'averaging window' is optimized separately for each set of connections between two arrays of amplifiers. The averaging window may be considered a one-dimensional spatial filter. See Pan et al., *IEEE J. of Solid State Circ.* 36(12):1847–1858 (December 2001).

In most publications, the averaging window has an infinite width neglecting edge effects). This is an artifact of the circuit implementation used, i.e., averaging is implemented by connecting resistors between the amplifier outputs. An averaging window with a finite width can be obtained if different circuit implementations are used, e.g., active averaging or capacitive averaging.

In general, finite width averaging windows provide better performance, since they have a smaller edge effect, and they average only across amplifiers that are in their linear region. The disadvantage is that they require many connections between the amplifiers. For example, as shown in FIG. 2, each "b" amplifier requires connections to four "a" amplifiers. This results in a considerable layout complexity, which can seriously degrade the ADC performance.

SUMMARY OF THE INVENTION

The present invention is directed to an analog to digital converter topology that substantially obviates one or more of the problems and disadvantages of the related art.

There is provided an analog to digital converter including a first amplifier array connected to taps from a reference ladder and to an input signal, a second amplifier array, wherein each amplifier in the first amplifier array is connected to only two amplifiers of the second amplifier array, a third amplifier array, wherein each amplifier in the second array is connected to only two amplifiers of the third amplifier array, and an encoder connected to outputs of the third amplifier array that converts the outputs to an N-bit digital signal.

In another aspect of the present invention there is provided an analog to digital converter including a reference ladder connected to an input voltage, a first amplifier array connected to taps from the reference ladder, a second amplifier array connected to the first amplifier array in an interleaved manner, a third amplifier array connected to the second amplifier array in an interleaved manner, and an encoder connected to outputs of the third amplifier array that converts the outputs to an N-bit digital signal representing the input voltage.

In another aspect of the present invention there is provided an analog to digital converter including a reference ladder connected to an input voltage, a first plurality of amplifiers connected to taps from the reference ladder, a second plurality of amplifiers connected to the first plurality in an interleaved manner, a third plurality of amplifiers connected to the second plurality in an interleaved manner, and an encoder connected to outputs of the third plurality that converts the outputs to an N-bit digital signal representing the input voltage.

In another aspect of the present invention there is provided an analog to digital converter including a reference ladder, a plurality of amplifier arrays "a", "b", "c" . . . "n" arranged in a cascade, wherein the amplifiers in the array "a" are connected to taps from the reference ladder and to an input voltage, a plurality of connections between consecutive arrays of the plurality of amplifier arrays "a", "b", "c" . . . "n", wherein the connections are configured for $m_a \times m_b \times m_c \times \ldots m_n \times$ averaging of the taps, $m_a$, $m_b$, $m_c$ . . . $m_n$ representing an averaging factor of the corresponding amplifier array, and an encoder connected to outputs of the "n" amplifier array that converts the outputs to an N-bit digital signal representing the input voltage.

In another aspect of the present invention there is provided an analog to digital converter including a first amplifier array connected to taps from a reference ladder and to an input signal, a second amplifier array, wherein each amplifier in the second amplifier array is connected to at least two amplifiers of the first amplifier array, a third amplifier array, wherein each amplifier in the third array is connected to two at least two amplifiers of the second amplifier array, wherein an output of each amplifier of the first array has only one path to a corresponding amplifier of the third array, and an encoder converting outputs of the third amplifier array to an N-bit digital signal representing the input signal.

In another aspect of the present invention there is provided an analog to digital converter including a reference ladder, a plurality of amplifier arrays $A_i$, i=1 through n, arranged in a cascade, wherein the amplifiers in the array $A_i$ are connected to taps from the reference ladder and to an input voltage, a plurality of connections between consecutive arrays of the plurality of amplifier arrays $A_i$, wherein each amplifier of each array $A_i$, i=2 through n, is connected to an output of a corresponding amplifier of an array $A_k$, k=1 through i−1, through only one path, and an encoder connected to outputs of the $A_n$ amplifier array that converts the outputs to an N-bit digital signal representing the input voltage.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 10 shows improvements obtained using the topology of the present invention;

DETAILED DESCRIPTION OF THE INVENTION

Reference will now be made in detail to the preferred embodiments of the present invention, examples of which are illustrated in the accompanying drawings.

Figure 3:
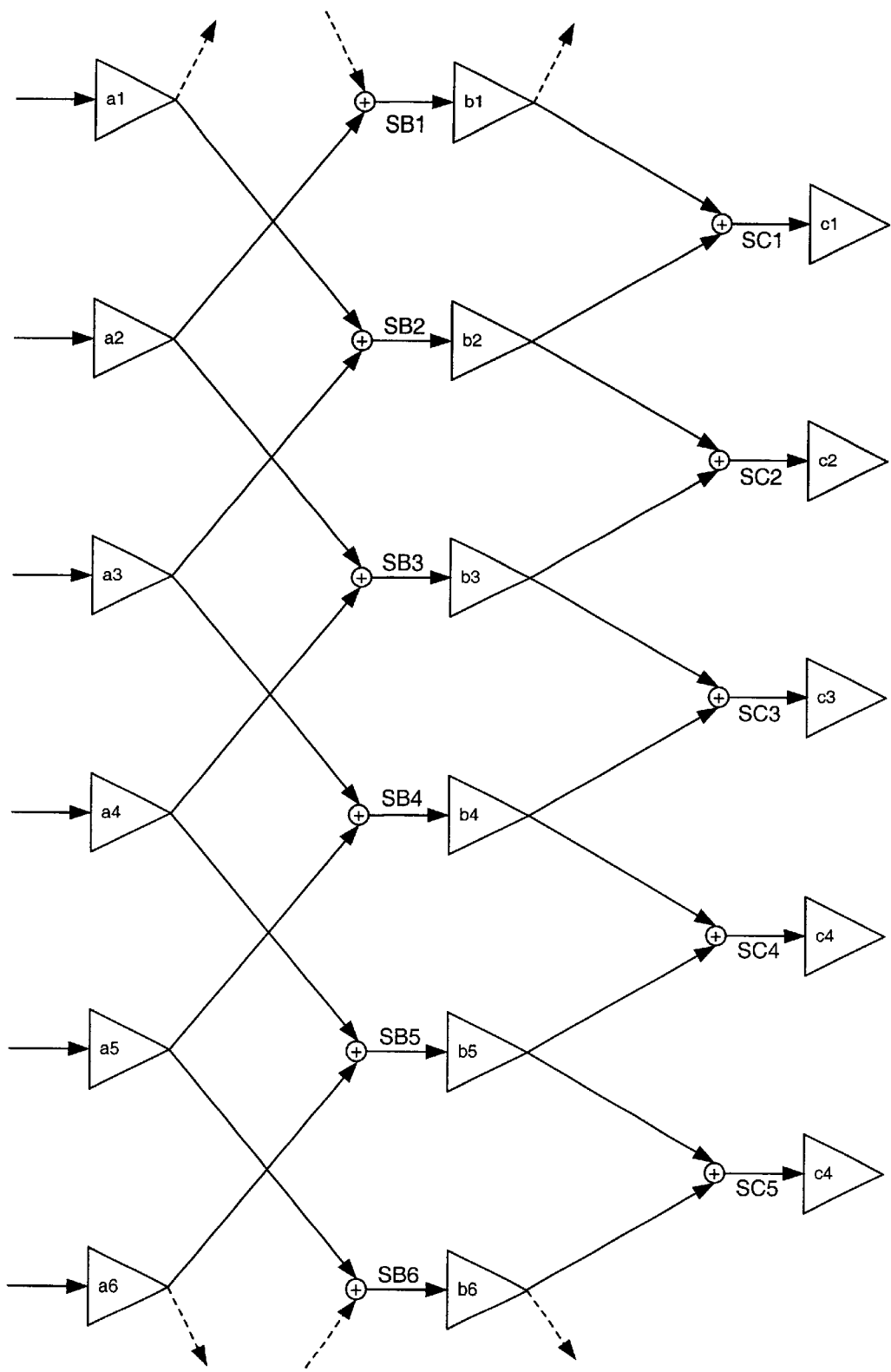
FIG. 3 illustrates an interleaved averaging topology of the present invention.

This disclosure describes new averaging topologies, whose primary advantage is a significant reduction in layout complexity, in turn, resulting in improved ADC performance. An example of a proposed averaging topology is shown in FIG. 3. As may be seen from FIG. 3, the topology of the present invention includes a number of amplifier arrays, for example, an amplifier array "a," an amplifier array "b," and an amplifier array "c," similar to that of FIG. 1. It should be noted that in real-life applications, there may be more than three arrays, for example, 4 or 5 arrays. The "a" array takes as inputs tap voltages from a reference ladder (such as the reference ladder 104 of FIG. 1), and from a track-and-hold amplifier (e.g., the track-and-hold 101 of FIG. 1). Typically, the amplifiers used are differential amplifiers, with differential inputs.

Figure 2:
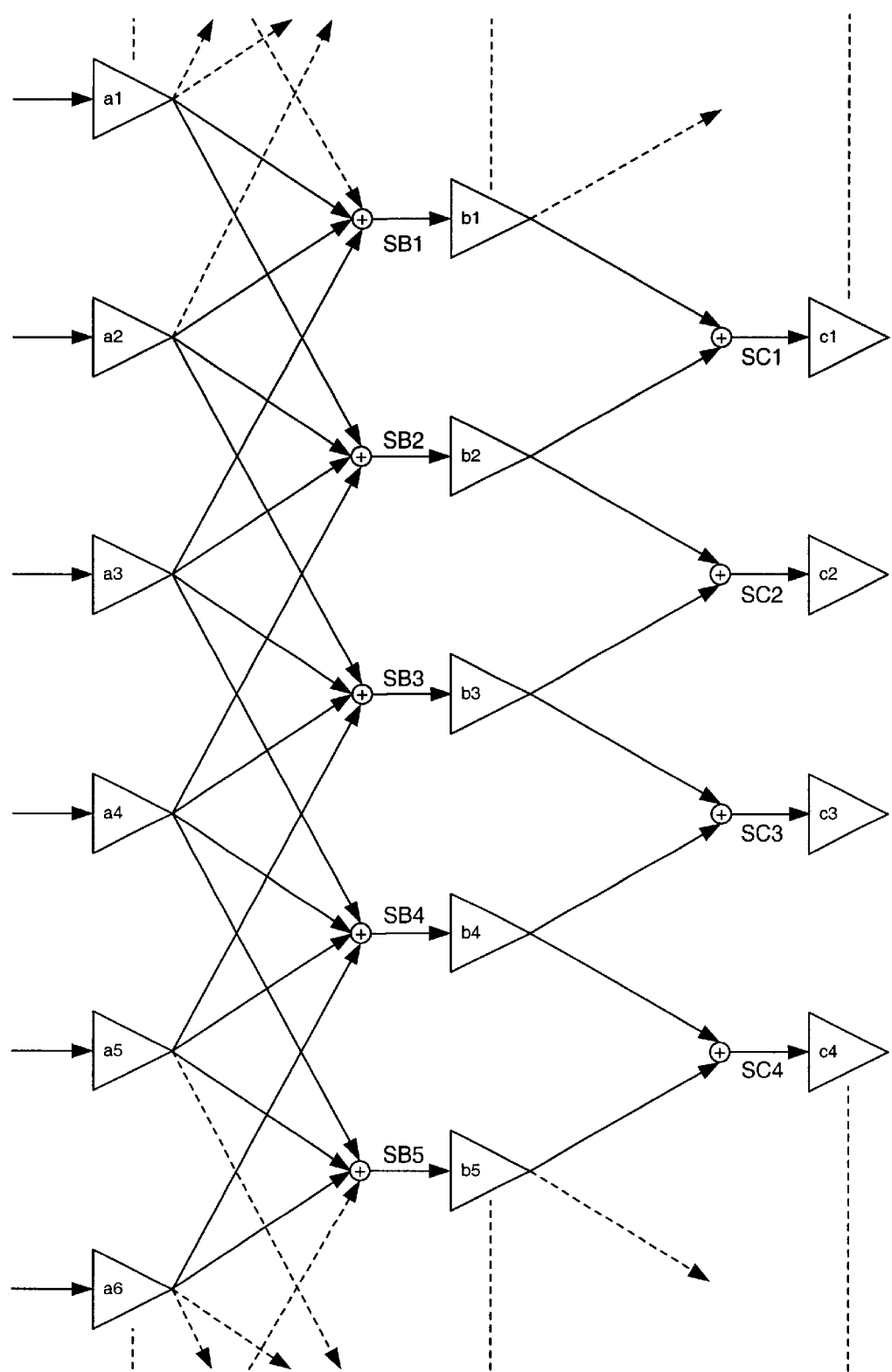
FIG. 2 illustrates a conventional averaging topology.

Although connections between the "c" array and "b" array are similar to that of FIG. 2, the connections between the "a" array and the "b" array are interleaved. Thus, each "b" amplifier takes inputs from only two amplifiers in array "a." Using amplifier b2 as an example, it takes inputs only from amplifiers a1 and a3, but not from a2. Thus, only two connections are required between each amplifier in the "b" array, and each amplifier in the "a" array. Nonetheless, each amplifier in the "c" array still ultimately connects to outputs of 4 amplifiers in the "a" array. In other words, taking amplifier c2 as an example, it connects to amplifiers a1, a2, a3, and a4 through the amplifiers b2 and b3 and summers SB2, SB3 and SC2. Accordingly, a 4× averaging interpolation is still accomplished, with the number of connections between the "b" array and the "a" array reduced by 50% as compared to conventional art. Furthermore, the outputs of the "a" array are now equally weighted. Since each "c" amplifier still does an averaging over 4 "a" amplifiers, the root mean square noise properties are taken advantage of, to reduce the noise. Furthermore, the outputs of the "a" array are now equally weighted.

The outputs of the "c" amplifiers are inputted into an array of comparators (not shown in FIG. 3, but which correspond to elements 107, 108 of FIG. 1), and then to an encoder (not shown in FIG. 3, which corresponds to the encoder 106 of FIG. 1), which converts the outputs of the comparators to an N-bit binary number representing the input signal.

It will be appreciated that while FIG. 3 shows an interleaving of adjacent amplifiers (i.e., "skipping" every other amplifier in a row), other interleaving arrangements are possible, including, for example, skipping every two, or every three amplifiers in a row.

Additionally, the topology of FIG. 3 is much easier to lay out compactly, due to a reduced number of connections between the "a" array and the "b" array, resulting in an estimated speed improvement of between 50 and 100%. In this topology, the averaging connections between the amplifiers are optimized for all connections simultaneously. This can result in a significant reduction in layout complexity. Comparing FIGS. 2 and 3, it is obvious that the required number of connections, and therefore, the layout complexity, is lower for the topology shown in FIG. 3.

An important characteristic of the topology shown in FIG. 3 can be observed when considering the averaging connections. When starting at the input of a "c" amplifier, there is always only (at most) one path to an output of an "a" amplifier. For example, the input of c2 connects to the output of a3 only through amplifier b2. In the conventional averaging topology, the input of c2 connects to the output of a3 both through amplifiers b2 and b3.

Another way of comparing conventional and the proposed averaging topologies is to compare the effective averaging accomplished for the same number of connections between the amplifiers. A table in FIG. 10 shows such a comparison for different numbers of connections between the "a" amplifiers and the "b" amplifiers, and between the "b" amplifiers and the "c" amplifiers. (The final row in the table also has averaging between the "c" amplifiers and a "d" array of amplifiers.) The fourth and fifth column in this table show across how many "a" amplifiers averaging has effectively been accomplished, for the conventional art and the proposed averaging topology, respectively. Note that emphasis is placed on averaging of the first row of amplifiers, because these are most sensitive to mismatch and noise. The last column in FIG. 10 shows the factor of improvement obtained.

Figure 4:
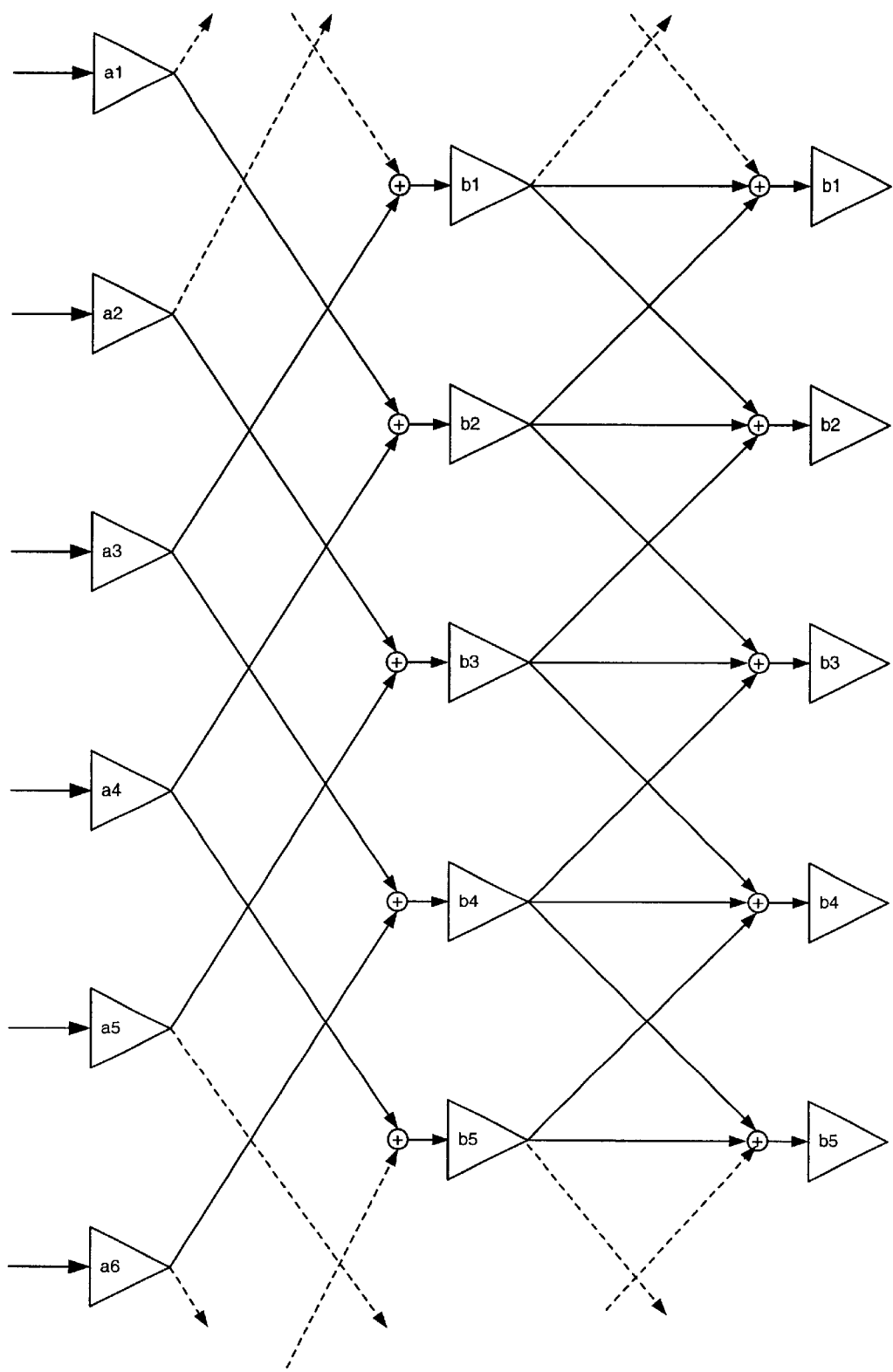
FIG. 4 shows a topology for 2×3× averaging.
Figure 5:
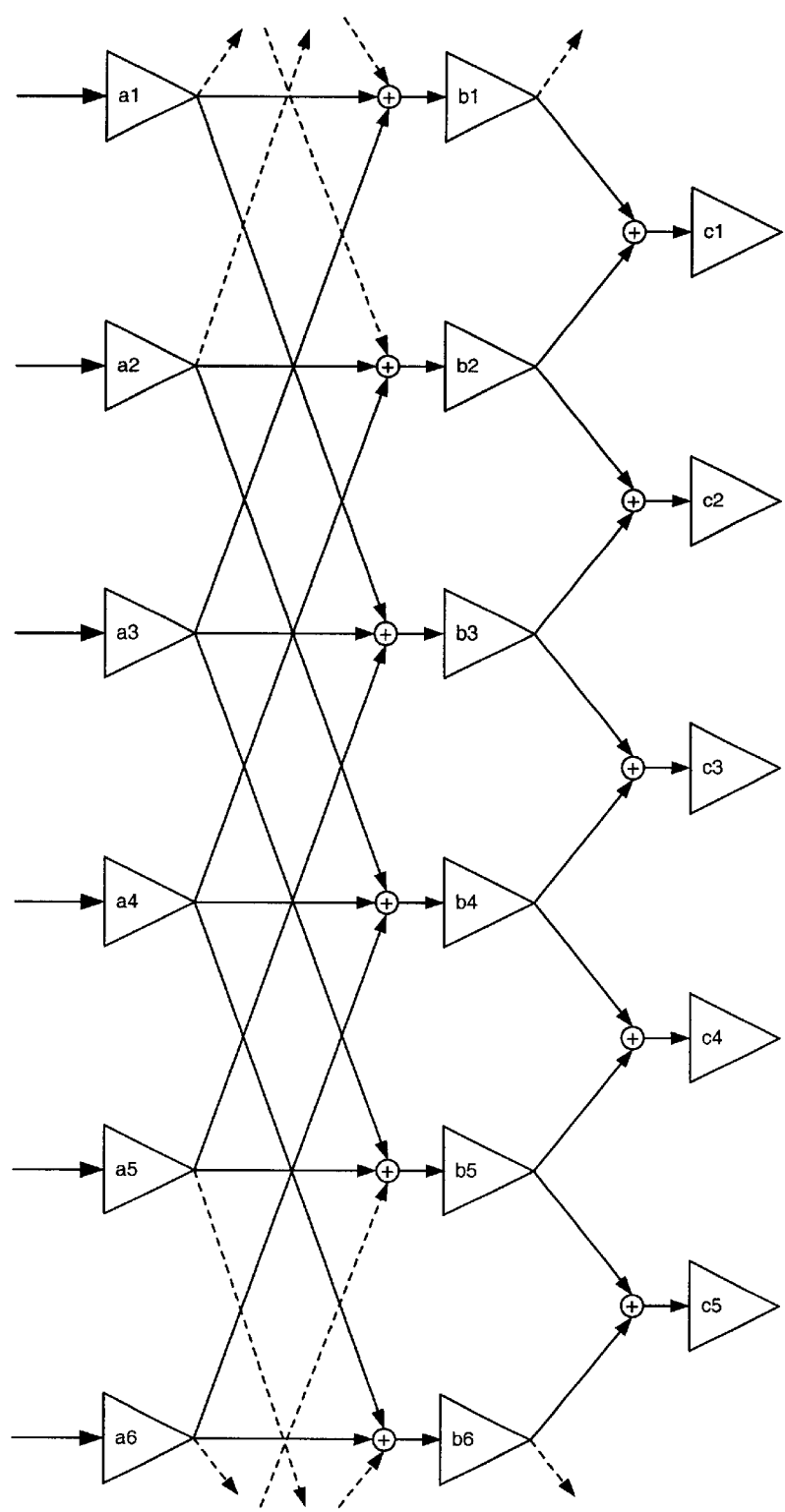
FIG. 5 shows a topology for 3×2× averaging.

Several generalizations of the topology shown in FIG. 3 are possible. If the depicted topology of FIG. 3 could be referred to as "2×2×" averaging, effectively implementing 4× averaging of the "a" amplifier array and 2× of the "b" amplifier array. A more general topology would implement "$m_a \times m_b \times$" averaging, effectively implementing "$m_a \times m_b \times$" averaging of the "a" amplifier array and $m_b \times$ of the "b" amplifier array. As an example, FIGS. 4 and 5 show the topologies for 2×3× averaging (i.e., $m_a=2$, $m_b=3$) and for 3×2× averaging, respectively.

Figure 6:
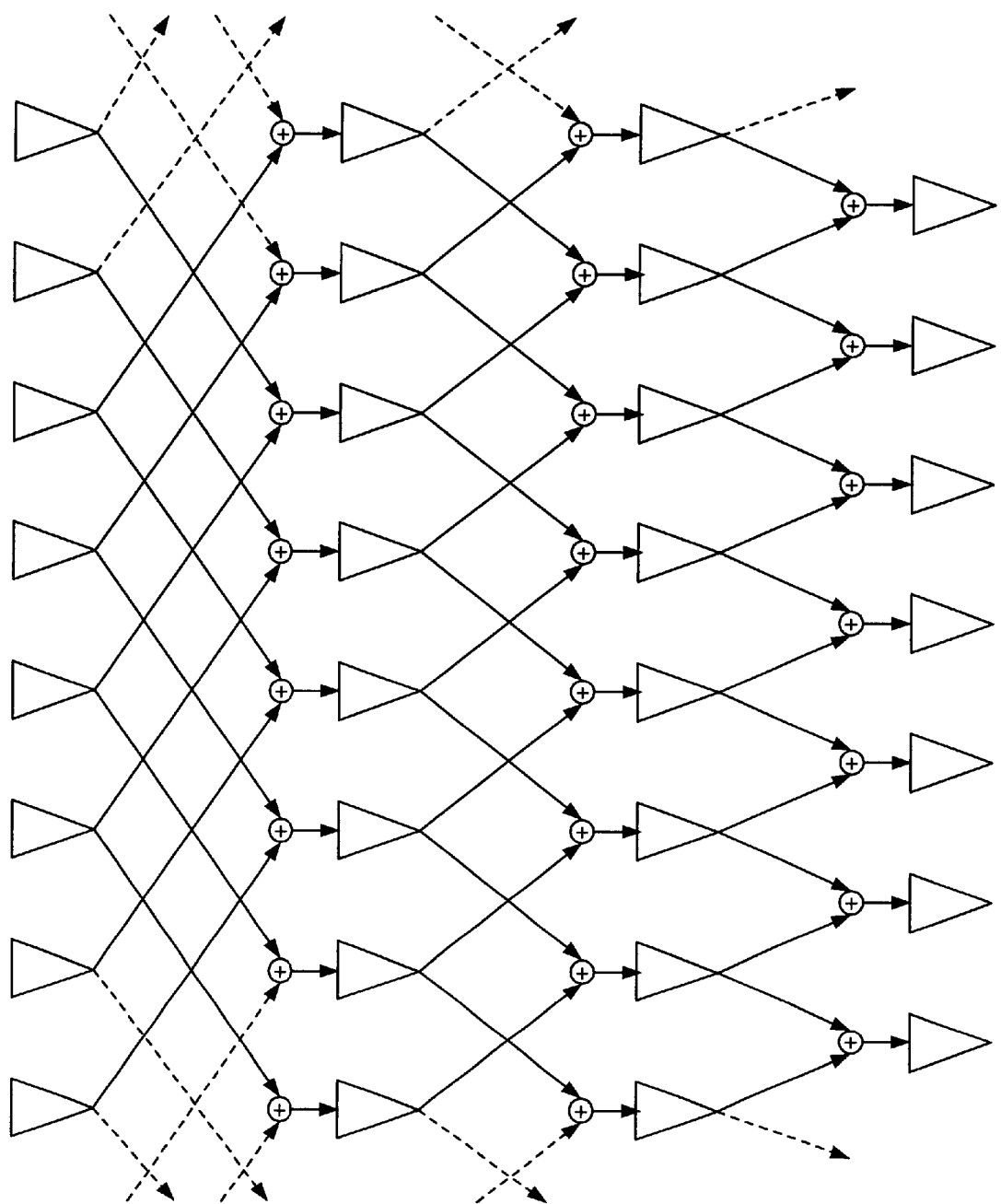
FIG. 6 shows a topology for 2×2×2× averaging

Further generalization is possible if more cascaded arrays of amplifiers are used in the ADC. As an example, FIG. 6 shows a topology for 2×2×2× averaging (i.e., $m_a=2$, $m_b=2$, $m_c=2$).

The most general averaging topology would then be referred to as "$m_a \times m_b \times m_c \times \ldots m_n \times$" averaging of amplifier arrays. "a", "b" ... "n", effectively implementing "$m_1 = m_a \times m_b \times m_c \ldots m_n \times$" averaging of the "a" amplifier array, "$m_2 = m_b \times m_c \times m_d \ldots m_n \times$" averaging of the "b" amplifier array, etc.

Note that the number $X_a$ of amplifiers that are "skipped" in the first row of amplifiers can be expressed by:

$$X_a = \frac{m_1}{m_a} - 1, \qquad (1)$$

the number $X_b$ of amplifiers that are "skipped" in the second row of amplifiers can be expressed by:

$$X_b = \frac{m_2}{m_b} - 1, \qquad (2)$$

etc.

Figure 7:
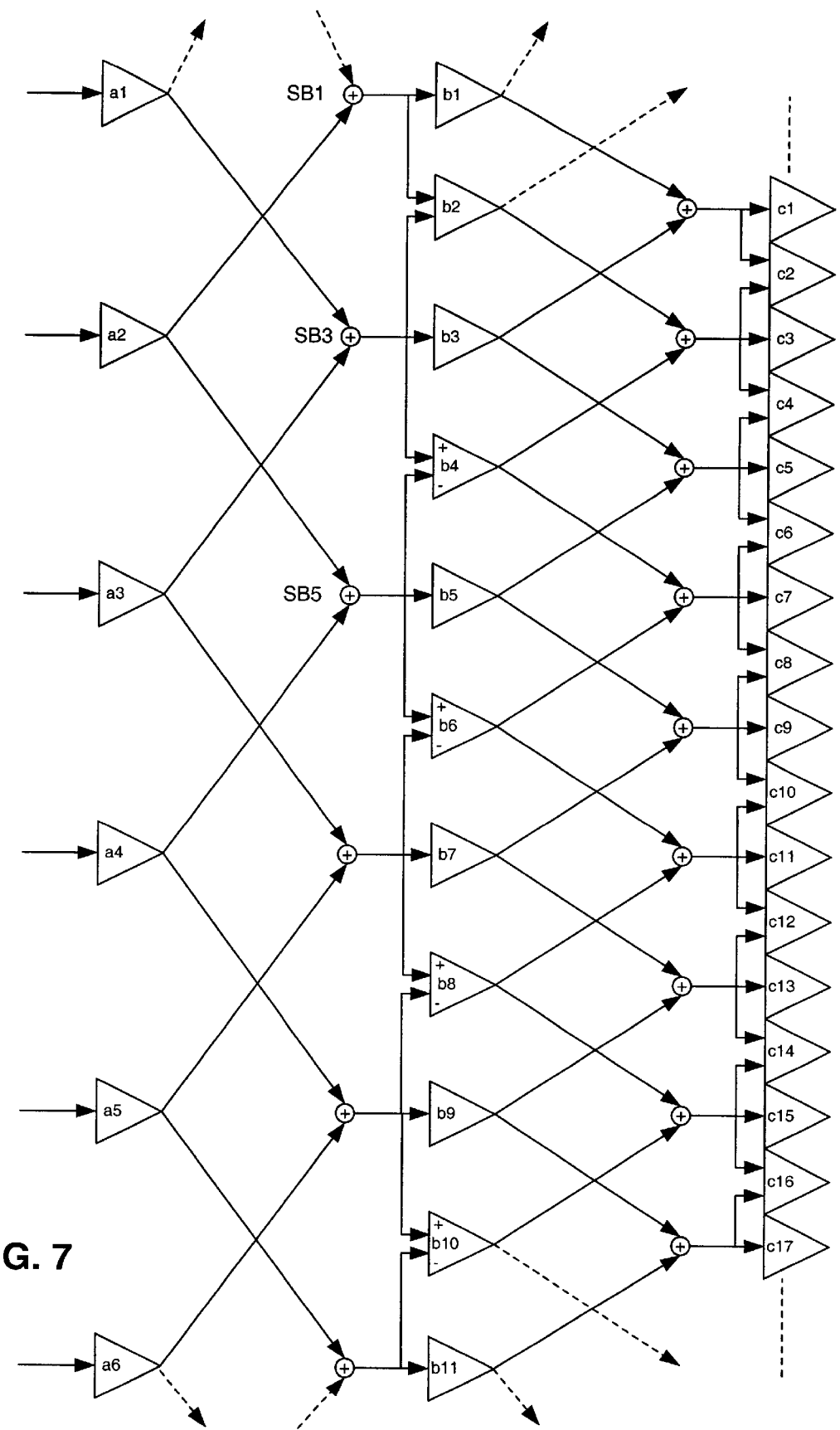
FIG. 7 illustrates an averaging topology of the present invention that also uses interpolation.

The proposed averaging topology can easily be combined with interpolation, a technique that can decrease a required number of amplifiers in the first row(s) of cascaded amplifiers. As an example, FIG. 7 shows the topology depicted in FIG. 2 supplemented with 4× averaging. As may be seen in FIG. 7, once the alternating amplifier outputs from the "a" array are summed, they are fed into three amplifiers in the "b" array. Thus, taking amplifiers a2 and a4 as an example, their output is summed by a summer SB5. The outputs of the amplifiers a1 and a3 are summed by the summer SB3. The input to the amplifier b5 is the output of the summer SB5, and the input to the amplifier b3 is the output of the summer SB3. The amplifier b4, however, is differentially inputted outputs of the summers SB3 and SB5.

Figure 8:
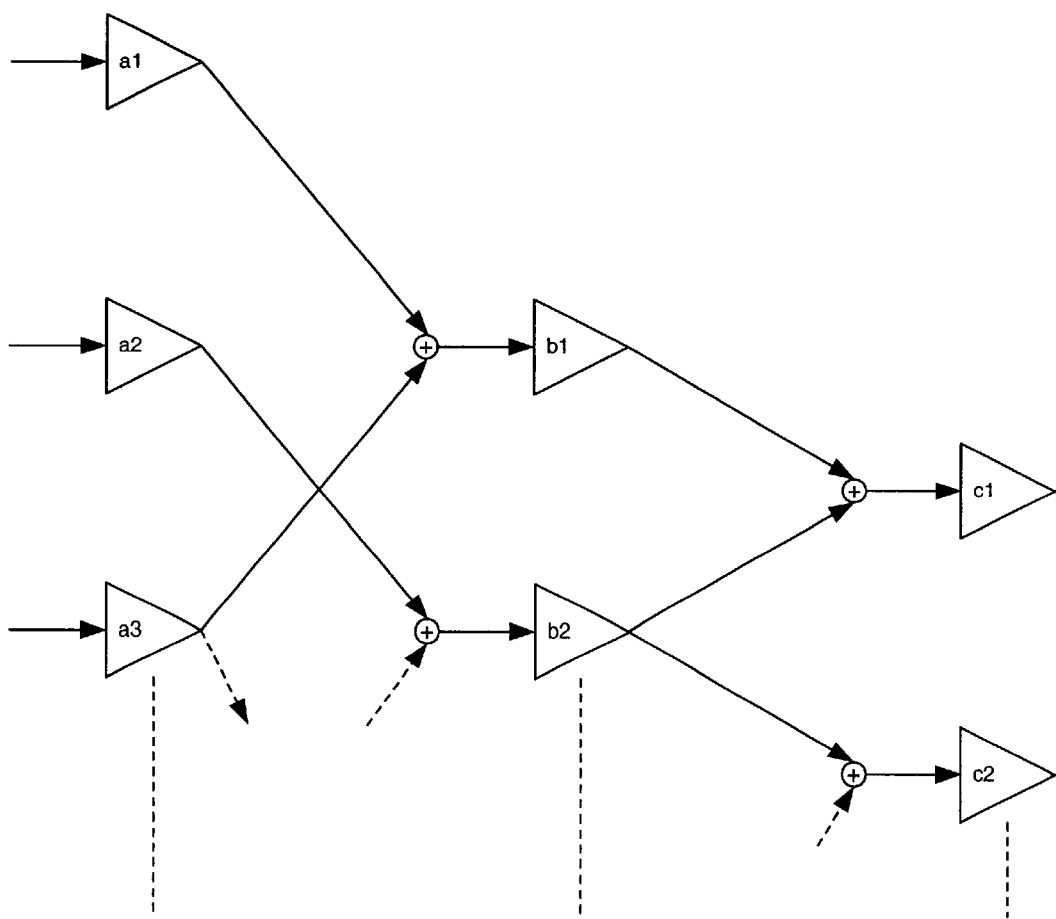
FIG. 8 illustrates the averaging topology of the present invention at an edge of the amplifier array.
Figure 9:
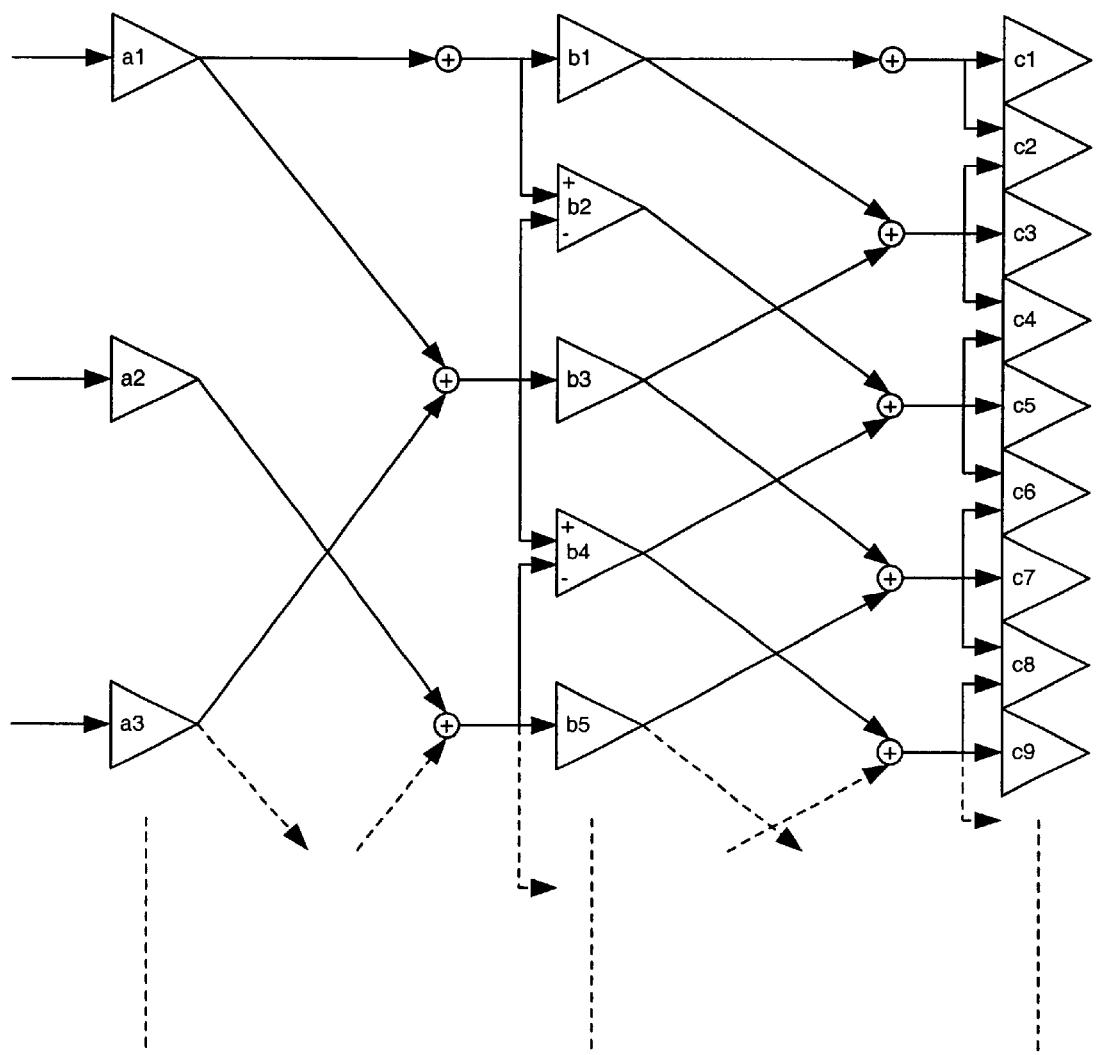
FIG. 9 illustrates a termination of the averaging topology of the present invention at the edge of the array of amplifiers that also utilizes differential interpolation.

An array of distributed amplifiers necessarily comprises a finite number of amplifiers. At the edges, special care has to be taken to avoid the occurrence of edge effects. FIGS. 8 and 9 propose two methods for terminating the averaging topology at the edges of the amplifier arrays.

A first method, shown in FIG. 8, uses a wider signal range for amplifier rows that are closer to the ADC input. This ensures that 4× averaging is maintained also for the "c" amplifiers that are close to, or at, the edges. The disadvantage is that a few extra amplifiers are required to remove the edge effect.

A second method (shown in FIG. 9) uses different connections between the amplifiers at the edges. For example, the input of the amplifier b1 now connects only to the output of the amplifier a1. The advantage is that the same signal range is maintained along all arrays of amplifiers. A small disadvantage is that the amount of averaging decreases at the edges. Fortunately, in subrange ADC's, the edges are usually used for overrange purposes, which makes offset and noise performance at the edges less important.

Figure 11:
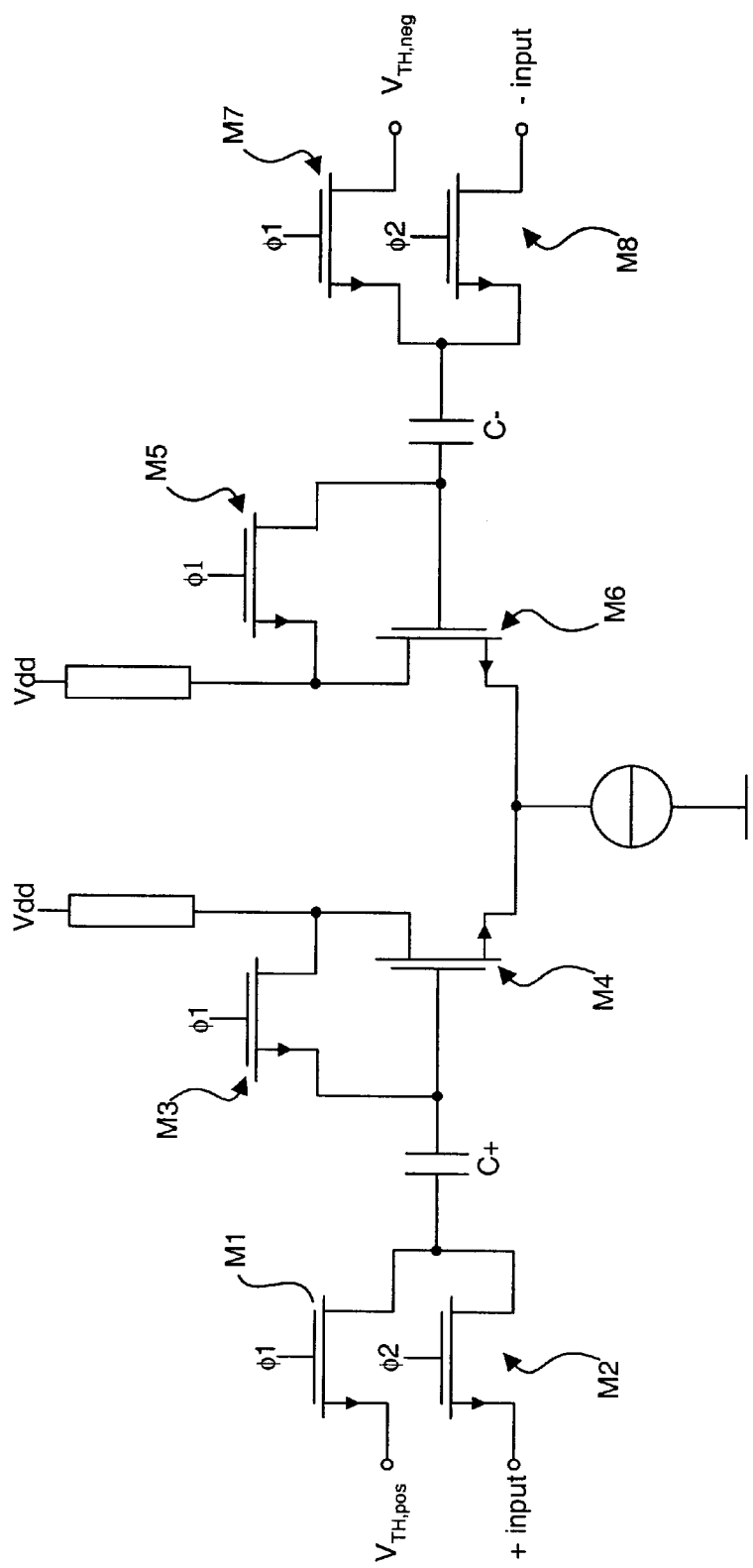
FIG. 11 illustrates an auto-zero amplifier used in the present invention.

The techniques are illustrated based on the auto-zero amplifier shown in FIG. 11. FIG. 11 illustrates the structure of one of the amplifiers in an amplifier array A1, A2, A3 . . . . (I.e., an amplifier used in a first array of cascaded arrays. The amplifiers in the first array have to connect to both the track-and-hold 101 and the reference ladder 104 on two different clock phases, while subsequent cascaded stages do not.) As shown in FIG. 11, a non-overlapping two-phase clock is used, with non-overlapping phases $\phi_1$ and $\phi_2$. At a "−" input of the amplifier, two NMOS transistors M1 and M2 are used, with a source of the transistor M2 being connected to the "−" input terminal, and a gate of the transistor M2 being connected to the clock phase $\phi_2$. A gate of the transistor M1 is driven by the clock phase $\phi_1$. The drains of the transistors M1 and M2 are tied together and connected to one side of a capacitor C−. The other side of the capacitor C− is connected to a source of a transistor M3, and to a gate of a transistor M4. A gate of the transistor M3 is connected to the clock phase $\phi_1$. Drains of the transistors M3 and M4 are tied together and a resistor that is connected to a positive supply voltage $V_{dd}$. A symmetrical structure is used for the "+" input, as shown in FIG. 11, using transistors M8, M7, M6 and M5, and a capacitor C+.

During clock phase $\phi_1$ the amplifier is in a reset mode and the sampling capacitors are charged to the value of the sampled voltage $V_{sample}$. During the next clock phase, $\phi_2$, the $\phi_1$ amplifier is connected to the reference ladder and the amplifier output voltage $V_{out}$ equals: $V_{out}=G \cdot (V_{ref}-V_{sample})$, where G is the voltage gain of the amplifier, $V_{ref}=V_{+input}-V_{-input}$ and $V_{sample}=V_{TH,pos}-V_{TH,neg}$.

Figure 12:
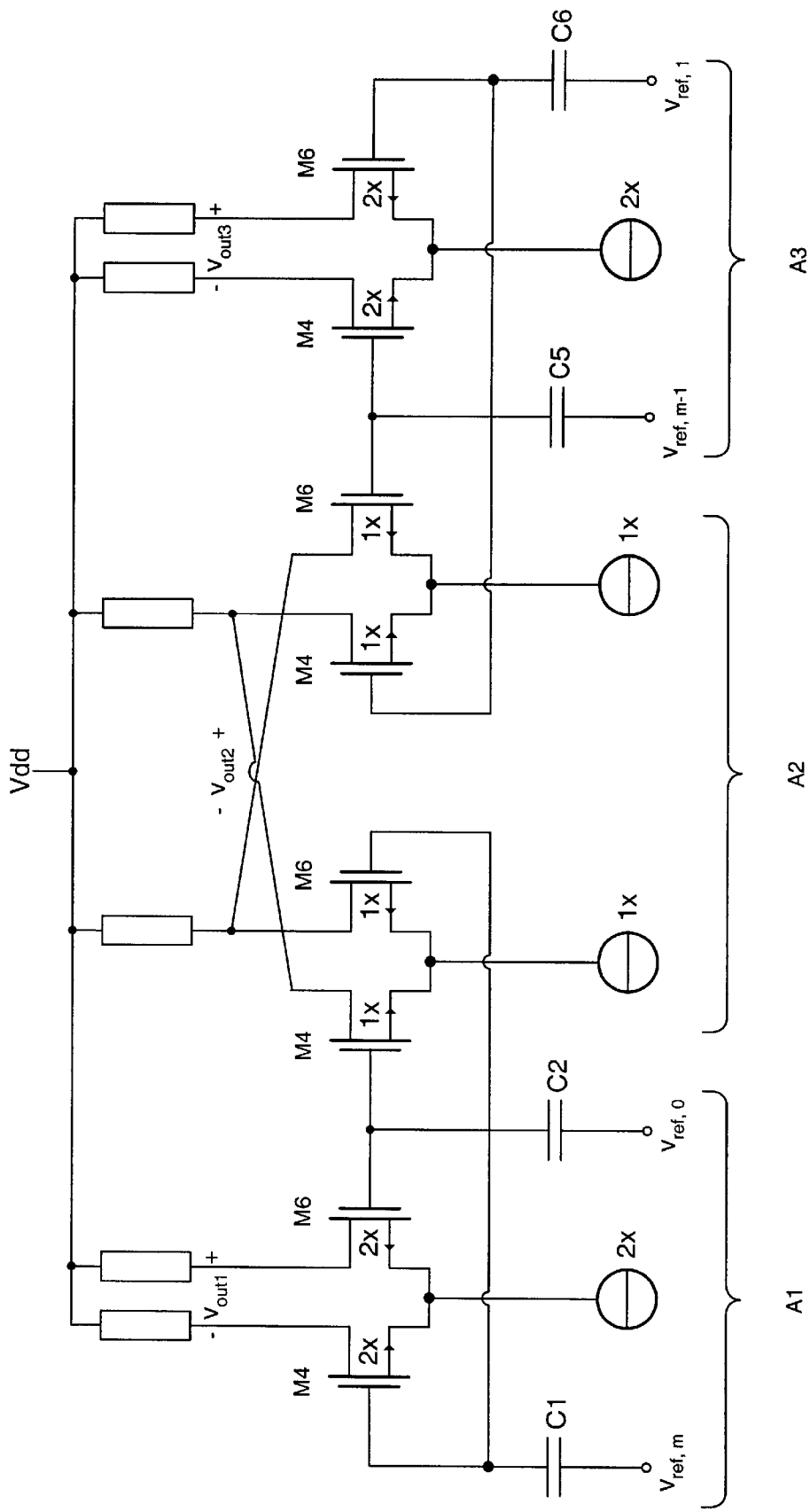
FIG. 12 illustrates an interpolation method of the present invention.

FIG. 12 illustrates the use of the auto zero amplifier of FIG. 11 in more detail and shows the three amplifiers A1, A2, A3 (without the switches driven by the two phase clock). The A1 and A3 amplifiers have their own input capacitors (C1, C2, and C5, C6, respectively), the A1 amplifier has differential inputs $V_{ref,m}/V_{ref,0}$, the amplifier A3 has differential inputs $V_{ref,m-1}/V_{ref,1}$. The amplifier A2 does not have its own input capacitors. Instead, the amplifier A2 comprises two differential transistor pairs M4, M6 (both half the size of the differential pairs M4, M6 of A1 and A3). It's current sources are each half of the current source of A1 or A3. Gates of one of the transistor pairs M4, M6 connect to the gates of the corresponding transistors of the A1 amplifier, and gates the other differential transistor pairs M4, M6 connect to corresponding gates of transistors of the A3 amplifier. The drain currents of the two differential transistor pairs of A2 are summed. As a result, output of the amplifier A2 ($V_{OUT,2}$) is (approximately) equal to the average of the outputs of A1 and A3 (i.e., the average of $V_{OUT,1}$ and $V_{OUT,3}$).

Figure 1:
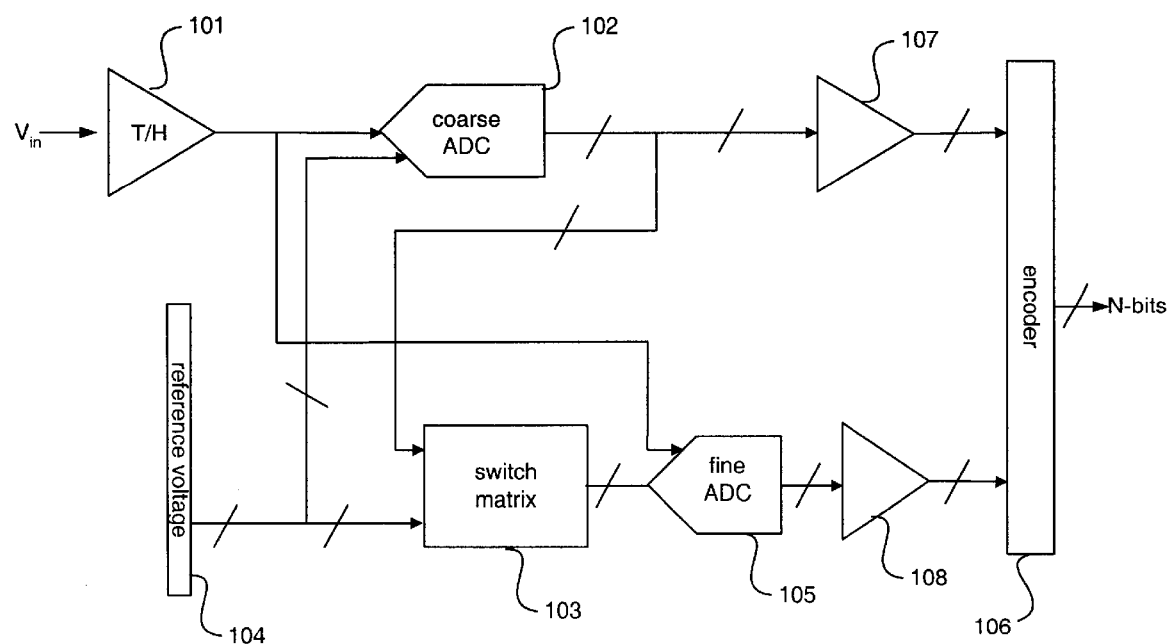
FIG. 1 illustrates a conventional sub-ranging ADC.

It will be appreciated that although the auto-zero amplifier of FIG. 11 is shown as using N channel MOSFET's, P channel MOSFET's can also be used. Note further that the track-and-hold 101 of FIG. 1 is typically a differential input and output amplifier.

Figure 13:
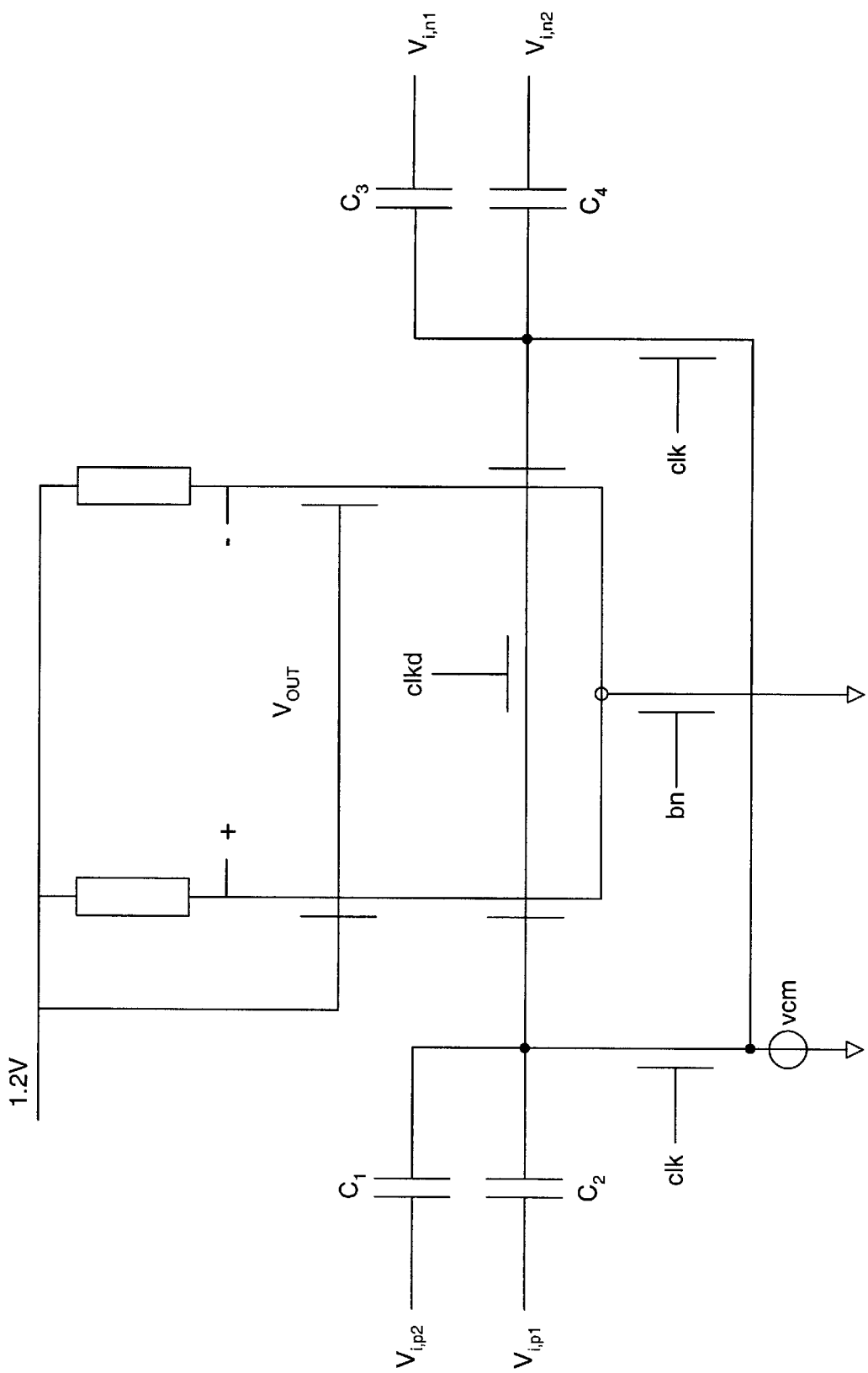
FIG. 13 illustrates a circuit diagram of averaging amplifier connection.

FIG. 13 illustrate a particular averaging implementation of 2× capacitive averaging. (the topology of FIG. 3). This is accomplished by splitting each input capacitor in two equal parts, to form four capacitors C1 through C4. C1 connects to a first positive input $V_{i,p1}$ and to the gate of one transistor in the differential pair. C2 connects to a second positive input $V_{i,p2}$ and to the gate of the same transistor in the differential pair. C3 connects to a first negative input $V_{i,n1}$ and to a gate of the other transistor in the differential pair. C4 connects to a second negative input $V_{i,n2}$ and to the gate of the other transistor in the differential pair. The inputs are connected to interleaved outputs of amplifiers of the preceding amplifier array. Capacitive averaging is now accomplished between charge sharing between C1 and C2 and between C3 and C4.

The averaging topologies described herein can be applied in many types of ADC architectures. In particular, it is very suitable for application in flash, folding and subranging ADC's. Various circuit implementation techniques, especially capacitive or active averaging, can be employed for implementing the proposed averaging topologies.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An analog to digital converter comprising:
   a first amplifier array connected to taps from a reference ladder and to an input signal;
   a second amplifier array, wherein each amplifier in the first amplifier array is connected to only two amplifiers of the second amplifier array;
   a third amplifier array, wherein each amplifier in the second array is connected to only two amplifiers of the third amplifier array; and
   an encoder converting outputs of the third amplifier array to an N-bit digital signal representing the input signal.

2. The analog to digital converter of claim 1, wherein alternating amplifiers of the second amplifier array have differential inputs that are connected to inputs of opposite polarity of adjacent amplifiers of the second amplifier array.

3. The analog to digital converter of claim 2, wherein alternating amplifiers of the third amplifier array have differential inputs that are connected to inputs of opposite polarity of adjacent amplifiers of the third amplifier array.

4. The analog to digital converter of claim 1, wherein the first, second and third amplifier arrays further each includes a first edge amplifier,
   wherein the first edge amplifier of the second amplifier array only takes an output of the first edge amplifier of the first amplifier array as an input, and
   wherein the first edge amplifier of the third amplifier array only takes an output of the first edge amplifier of the second amplifier array as an input.

5. The analog to digital converter of claim 4, wherein the first, second and third amplifier arrays further each includes a second edge amplifier,
   wherein the second edge amplifier of the second amplifier array only takes an output of the second edge amplifier of the first amplifier array as an input, and
   wherein the second edge amplifier of the third amplifier array only takes an output of the second edge amplifier of the second amplifier array as an input.

6. The analog to digital converter of claim 1, wherein alternating amplifiers of the third amplifier array have differential inputs that are connected to inputs of opposite polarity of adjacent amplifiers of the third amplifier array.

7. The analog to digital converter of claim 1, wherein the first, second and third amplifier arrays further each includes a first edge amplifier,
   wherein an output of the first edge amplifier of the first amplifier array in only connected to an input of the edge amplifier of the second array, and
   wherein an output of the first edge amplifier of the second amplifier array in only connected to an input of the edge amplifier of the third array.

8. The analog to digital converter of claim 1, wherein the amplifiers that are connected to a particular amplifier in the second array have at least two amplifiers of the first array between them.

9. An analog to digital converter comprising:
   a reference ladder;
   a first amplifier array connected to taps from the reference ladder and to an input signal;
   a second amplifier array connected to the first amplifier array in an interleaved manner;
   a third amplifier array connected to the second amplifier array in an interleaved manner; and
   an encoder converting outputs of the third amplifier array to an N-bit digital signal representing the input signal.

10. The analog to digital converter of claim 9, wherein the first, second and third amplifier arrays further each includes a first edge amplifier,
    wherein the first edge amplifier of the second amplifier array only takes an output of the first edge amplifier of the first amplifier array as an input, and wherein the first edge amplifier of the third amplifier array only takes an output of the first edge amplifier of the second amplifier array as an input.

11. The analog to digital converter of claim 10, wherein the first, second and third amplifier arrays further each includes a second edge amplifier, wherein the second edge amplifier of the second amplifier array only takes an output of the second edge amplifier of the first amplifier array as an input, and wherein the second edge amplifier of the third amplifier array only takes an output of the second edge amplifier of the second amplifier array as an input.

12. The analog to digital converter of claim 9, wherein alternating amplifiers of the second amplifier array have differential inputs that are connected to inputs of opposite polarity of adjacent amplifiers of the second amplifier array.

13. The analog to digital converter of claim 9, wherein alternating amplifiers of the third amplifier array have differential inputs that are connected to inputs of opposite polarity of adjacent amplifiers of the third amplifier array.

14. The analog to digital converter of claim 9, wherein the first amplifier array includes a first amplifier, a second amplifier and a third amplifier, wherein the first and third amplifiers each include a differential transistor pair whose sources are connected to a current sources, whose drains are each connected to a supply voltage through a corresponding resistor and whose gates are each connected to corresponding input capacitors, wherein the second amplifier includes two cross-connected differential transistor pairs whose sources are connected to a current source, whose drains are each connected to the supply voltage through a corresponding resistor and whose gates are each connected to corresponding input capacitors of the first and third amplifiers of same polarity inputs.

15. The analog to digital converter of claim 9, wherein the first, second and third amplifier arrays further each includes a first edge amplifier, wherein an output of the first edge amplifier of the first amplifier array in only connected to an input of the edge amplifier of the second array, and wherein an output of the first edge amplifier of the second amplifier array in only connected to an input of the edge amplifier of the third array.

16. An analog to digital converter comprising:

a first plurality of amplifiers differentially connected to taps from a reference ladder and to an input signal;

a second plurality of amplifiers, wherein each amplifier in the first plurality is connected to only two amplifiers of the second plurality;

a third plurality of amplifiers, wherein each amplifier in the second plurality is connected to only two amplifiers of the third plurality; and an encoder converting outputs of the third plurality of amplifiers to an N-bit digital signal corresponding to the input signal.

17. The analog to digital converter of claim 16, wherein alternating amplifiers of the second plurality have differential inputs that are connected to inputs of opposite polarity of adjacent amplifiers of the second plurality.

18. The analog to digital converter of claim 17, wherein alternating amplifiers of the third plurality have differential inputs that are connected to inputs of opposite polarity of adjacent amplifiers of the third plurality.

19. The analog to digital converter of claim 16, wherein the first, second and third pluralities further each includes a first edge amplifier, wherein the first edge amplifier of the second plurality only takes an output of the first edge amplifier of the first plurality as an input, and wherein the first edge amplifier of the third plurality only takes an output of the first edge amplifier of the second plurality as an input.

20. The analog to digital converter of claim 19, wherein the first, second and third pluralities further each includes a second edge amplifier, wherein the second edge amplifier of the second plurality only takes an output of the second edge amplifier of the first plurality as an input, and wherein the second edge amplifier of the third plurality only takes an output of the second edge amplifier of the second plurality as an input.

21. The analog to digital converter of claim 16, wherein alternating amplifiers of the third plurality have differential inputs that are connected to inputs of opposite polarity of adjacent amplifiers of the third plurality.

22. The analog to digital converter of claim 16, wherein the first, second and third pluralities further each includes a first edge amplifier, wherein an output of the first edge amplifier of the first plurality in only connected to an input of the edge amplifier of the second plurality, and wherein an output of the first edge amplifier of the second amplifier plurality in only connected to an input of the edge amplifier of the third plurality.

23. An analog to digital converter comprising:

a reference ladder;

a first plurality of amplifiers differentially connected to taps from the reference ladder and to an input signal;

a second plurality of amplifiers connected to the first plurality in an interleaved manner;

a third plurality of amplifiers connected to the second plurality in an interleaved manner; and an encoder converting outputs of the third plurality of amplifiers to an N-bit digital signal representing the input signal.

24. The analog to digital converter of claim 23, wherein alternating amplifiers of the second plurality have differential inputs that are connected to inputs of opposite polarity of adjacent amplifiers of the second plurality.

25. The analog to digital converter of claim 24, wherein alternating amplifiers of the third plurality have differential inputs that are connected to inputs of opposite polarity of adjacent amplifiers of the third plurality.

26. The analog to digital converter of claim 23, wherein the first, second and third pluralities further each includes a first edge amplifier, wherein the first edge amplifier of the second plurality only takes an output of the first edge amplifier of the first plurality as an input, and wherein the first edge amplifier of the third plurality only takes an output of the first edge amplifier of the second plurality as an input.

27. The analog to digital converter of claim 26, wherein the first, second and third pluralities further each includes a second edge amplifier, wherein the second edge amplifier of the second plurality only takes an output of the second edge amplifier of the first plurality as an input, and wherein the second edge amplifier of the third plurality only takes an output of the second edge amplifier of the second plurality as an input.

28. The analog to digital converter of claim 23, wherein alternating amplifiers of the third plurality have differential inputs that are connected to inputs of opposite polarity of adjacent amplifiers of the third plurality.

29. An analog to digital converter comprising:

a reference ladder;

a plurality of amplifier arrays "a", "b", "c" . . . "n" arranged in a cascade, wherein the amplifiers in the array "a" are connected to taps from the reference ladder and to an input voltage;

a plurality of connections between consecutive arrays of the plurality of amplifier arrays "a", "b", "c" . . . "n", wherein the connections are configured for $m_a \times m_b \times m_c \times \ldots m_n \times$ averaging of the taps, $m_a, m_b, m_c \ldots m_n$ representing an averaging factor of the corresponding amplifier array; and an encoder connected to outputs of the "n" amplifier array that converts the outputs to an N-bit digital signal representing the input voltage.

30. An analog to digital converter comprising:

a first amplifier array connected to taps from a reference ladder and to an input signal;

a second amplifier array, wherein each amplifier in the second amplifier array is connected to at least two amplifiers of the first amplifier array;

a third amplifier array, wherein each amplifier in the third array is connected to at least two amplifiers of the second amplifier array, wherein an output of each amplifier of the first array has only one path to a corresponding amplifier of the third array; and an encoder converting outputs of the third amplifier array to an N-bit digital signal representing the input signal.

31. An analog to digital converter comprising:

a reference ladder;

a plurality of cascaded amplifier arrays $A_i$, i=1 through n, wherein the amplifiers in the array $A_1$ are connected to taps from the reference ladder and to an input voltage;

a plurality of connections between neighboring arrays of the plurality of amplifier arrays $A_i$, wherein each amplifier of each array $A_i$, i=2 through n, is connected to an output of a corresponding amplifier of an array $A_k$, k=1 through i−1, through only one path; and an encoder connected to outputs of the $A_n$ amplifier array that converts the outputs to an N-bit digital signal representing the input voltage.

32. An analog to digital converter comprising:

a first plurality of amplifiers connected to taps from a reference ladder and to an input signal;

a second plurality of amplifiers, wherein each amplifier in the first plurality is connected to only two amplifiers of the second plurality;

a third plurality of amplifiers, wherein each amplifier in the third plurality is connected to at least two amplifiers of the second plurality; and an encoder converting outputs of the third plurality of amplifiers to an N-bit digital signal corresponding to the input signal.

33. An analog to digital converter comprising:

a reference ladder;

a plurality of amplifier arrays "a", "b", "c" . . . "n" arranged in a cascade, wherein the amplifiers in the array "a" are connected to taps from the reference ladder and to an input voltage;

wherein connections between consecutive arrays are configured for $m_a \times m_b \times m_c \times \ldots m_n \times$ averaging of the taps, $m_a, m_b, m_c \ldots m_n$ representing an averaging factor of the corresponding amplifier array, wherein "$m_1 = m_a \times m_b \times m_c \ldots m_n \times$" represents an averaging of the "a" amplifier array, "$m_2 = m_b \times m_c \times m_d \ldots m_n \times$" represents an averaging of the "b" amplifier array, and so on, wherein a number of amplifiers $X_a$ that are "skipped" in the "a" amplifier array is $$X_a = \frac{m_1}{m_a} - 1,$$

wherein a number of amplifiers $X_b$ that are "skipped" in the "b" amplifier array is $$X_b = \frac{m_2}{m_b} - 1,$$

and so on; and an encoder connected to outputs of the "n" amplifier array that converts the outputs to an N-bit digital signal representing the input voltage.

* * * * *

UNITED STATES PATENT AND TRADEMARK OFFICE
CERTIFICATE OF CORRECTION

PATENT NO. : 6,628,224 B1  Page 1 of 1
DATED : September 30, 2003
INVENTOR(S) : Mulder et al.

It is certified that error appears in the above-identified patent and that said Letters Patent is hereby corrected as shown below:

Column 2,
Line 28, after "width" a "(" should be inserted;

Column 3,
Line 30, "two" should be deleted;

Column 7,
Line 7, "$V_{ret}$" should be deleted and replaced with -- $V_{ref}$ --;
Line 36, "illustrate" should be deleted and replaced with -- illustrates --;

Column 8,
Lines 42 and 45, "in" should be deleted and replaced with -- is --;

Column 9,
Lines 42 and 45, "in" should be deleted and replaced with -- is --;

Column 10,
Lines 27 and 31, "in" should be deleted and replaced with -- is --;

Signed and Sealed this

Twenty-third Day of March, 2004

JON W. DUDAS
*Acting Director of the United States Patent and Trademark Office*